United States Patent
Brech et al.

(10) Patent No.: US 12,446,285 B2
(45) Date of Patent: Oct. 14, 2025

(54) GROUP III NITRIDE-BASED TRANSISTOR DEVICE

(71) Applicant: Infineon Technologies AG, Neubiberg (DE)

(72) Inventors: Helmut Brech, Lappersdorf (DE); John Twynam, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 385 days.

(21) Appl. No.: 17/921,781

(22) PCT Filed: Apr. 28, 2021

(86) PCT No.: PCT/EP2021/061165
§ 371 (c)(1),
(2) Date: Oct. 27, 2022

(87) PCT Pub. No.: WO2021/219740
PCT Pub. Date: Nov. 4, 2021

(65) Prior Publication Data
US 2023/0170393 A1 Jun. 1, 2023

(30) Foreign Application Priority Data

Apr. 28, 2020 (EP) ..................... 20171930

(51) Int. Cl.
*H10D 30/47* (2025.01)
*H01L 21/765* (2006.01)
(Continued)

(52) U.S. Cl.
CPC .......... *H10D 64/111* (2025.01); *H01L 21/765* (2013.01); *H01L 23/291* (2013.01);
(Continued)

(58) Field of Classification Search
CPC ........................ H10D 30/475; H10D 30/4755
See application file for complete search history.

(56) References Cited

U.S. PATENT DOCUMENTS

| 7,915,644 B2 | 3/2011 | Wu et al. |
| 9,443,941 B2 | 9/2016 | Häberlen et al. |

(Continued)

FOREIGN PATENT DOCUMENTS

CN 105409007 A 3/2016

*Primary Examiner* — Grant S Withers
(74) *Attorney, Agent, or Firm* — Murphy, Bilak & Homiller, PLLC (57) ABSTRACT

A Group III nitride-based transistor device is provided that has a gate drain capacitance ($C_{GD}$), a drain source capacitance ($C_{DS}$) and a drain source on resistance (RDSon). A ratio of the gate drain capacitance ($C_{GD}$) at a drain source voltage ($V_{DS}$) of 0V, $C_{GD}$ (0V), and the gate drain capacitance $C_{GD}$ at a value of $V_{DS}$>0V, $C_{GD}V$, is at least 3:1, wherein $V_{DS}$ is less than 15V.

22 Claims, 7 Drawing Sheets

(51) Int. Cl.
  *H01L 23/29* (2006.01)
  *H01L 23/31* (2006.01)
  *H10D 30/01* (2025.01)
  *H10D 62/824* (2025.01)
  *H10D 62/85* (2025.01)
  *H10D 64/00* (2025.01)
  *H10D 64/01* (2025.01)

(52) U.S. Cl.
  CPC ....... *H01L 23/3171* (2013.01); *H10D 30/015* (2025.01); *H10D 30/475* (2025.01); *H10D 30/4755* (2025.01); *H10D 62/824* (2025.01); *H10D 62/8503* (2025.01); *H10D 64/01* (2025.01)

(56) References Cited

U.S. PATENT DOCUMENTS

| | | |
|---|---|---|
| 2007/0235775 A1 | 10/2007 | Wu et al. |
| 2008/0272443 A1 | 11/2008 | Hoshi et al. |
| 2017/0133496 A1 | 5/2017 | Tsai et al. |

GROUP III NITRIDE-BASED TRANSISTOR DEVICE

BACKGROUND

To date, transistors used in power electronic applications have typically been fabricated with silicon (Si) semiconductor materials. Common transistor devices for power applications include Si CoolMOS®, Si Power MOSFETs, and Si Insulated Gate Bipolar Transistors (IGBTs). More recently, silicon carbide (SiC) power devices have been considered. Group III-N semiconductor devices, such as gallium nitride (GaN) devices, are now emerging as attractive candidates to carry large currents, support high voltages and to provide very low on-resistance and fast switching times.

Gallium nitride devices are also attractive candidates for Power Amplifiers for communication systems. The advantages of III-nitride materials, such as high values of breakdown field, saturation velocity and low-field mobility, outperform silicon-based devices in terms of efficiency and power density.

Further improvements to Group III nitride-based devices are, however, desirable. High 2DEG density (resulting in low Rdson and high saturation currents) leads to high parasitic caps (e.g. the gate drain capacitance $C_{GD}$) which may have unwanted effects particularly for RF-applications. The challenge is to minimize the parasitic caps well below the operating voltage without decreasing the 2DEG density.

SUMMARY

According to the invention, a Group III nitride-based transistor device comprises a source electrode, a drain electrode and a gate electrode positioned on a first major surface of a Group III nitride based-based layer, wherein the gate is laterally arranged between the source electrode and the drain electrode. The Group III nitride-based transistor device also comprises a field plate that is laterally arranged between and spaced apart from the gate electrode and the drain electrode.

In some embodiments, a base of the gate electrode has a width of 50 nm to 500 nm, or 30 nm to 350 nm, for example around 250 nm and the distance between the gate electrode and the field plate at the closest point is 30 nm to 500 nm or 30 nm to 350 nm, for example around 250 nm. In some embodiments, a base of the gate electrode and a base of the field plate each have a width of 200 nm to 350 nm, for example around 250 nm and the distance between the gate electrode and the field plate at the closest point is 200 nm to 350 nm, for example around 250 nm.

In some embodiments, a Group III nitride-based transistor device has a gate drain capacitance ($C_{GD}$), a drain source capacitance ($C_{DS}$) and a drain source on resistance (RDSon). In some embodiments, a ratio of the gate drain capacitance ($C_{GD}$) at a drain source voltage ($V_{DS}$) of 0V, $C_{GD}(0V)$, and the gate drain capacitance $C_{GD}$ at a value of $V_{DS}>0V$, $C_{GD}V$, is at least 2:1, or at least 6:1, wherein $V_{DS}$ is less than 20V. In some embodiments the ratio of the gate drain capacitance ($C_{GD}$) at a at least 3:1, wherein $V_{DS}$ is less than 15V.

In some embodiments, the ratio of the value of $C_{GD}$ at a $V_{DS}=0V$ and the value of $C_{GD}$ at a $V_{DS}$ voltage in the range of $0<V_{DS}<15V$ is greater than 2.5 and/or the ratio of the value of $C_{GD}$ at a $V_{DS}=0V$ and the value of $C_{GD}$ at a $V_{DS}$ voltage in the range of $0<V_{DS}<15V$ is greater than 4 and/or the ratio of the value of $C_{GD}$ at a $V_{DS}=0V$ and the value of $C_{GD}$ at a $V_{DS}$ voltage in the range of $0<V_{DS}<15V$ is greater than 5 and/or the ratio of the value of $C_{GD}$ at a $V_{DS}=0V$ and the value of $C_{GD}$ at a $V_{DS}$ voltage in the range of $0<V_{DS}<12V$ is greater than 3 and/or the ratio of the value of $C_{GD}$ at a $V_{DS}=0V$ and the value of $C_{GD}$ at a $V_{DS}$ voltage in the range of $0<V_{DS}<20V$ is greater than 6 and/or the ratio of the value of $C_{GD}$ at a $V_{DS}=0V$ and the value of $C_{GD}$ at a $V_{DS}$ voltage in the range of $0<V_{DS}<12V$ is greater than 10 and/or the ratio of the value of $C_{GD}$ at a $V_{DS}=0V$ and the value of $C_{GD}$ at a $V_{DS}$ voltage in the range of $0<V_{DS}<10V$ is greater than 15.

In some embodiments, a Group III nitride-based transistor device comprises a source electrode, a drain electrode and a gate electrode positioned on a first major surface of a Group III nitride based-based layer, wherein the gate is laterally arranged between the source electrode and the drain electrode, a passivation layer arranged on the first major surface, and a field plate electrically connected to the source electrode, the field plate having a lower surface arranged on the passivation layer, the field plate being laterally arranged between and laterally spaced apart from the gate electrode and the drain electrode. This Group III nitride-based transistor device has a gate drain capacitance ($C_{GD}$), a drain source capacitance ($C_{DS}$) and a drain source on resistance (RDSon). A ratio of the gate drain capacitance ($C_{GD}$) at a drain source voltage ($V_{DS}$) of 0V, $C_{GD}(0V)$, and the gate drain capacitance $C_{GD}$ at a value of $V_{DS}>0V$, $C_{GD}V$, is at least 3:1, wherein $V_{DS}$ is less than 15V.

In some embodiments, $dC_{GD}/dV_{DS}$ over a subrange of values of $V_{DS}$ is less than −10 fF/mm/V, the subrange of values being greater than 100 mV and within a range of VDS wherein $5V<V_{DS}<20V$, preferably $5V<V_{DS}<15V$. In some embodiments, $dC_{GD}/dV_{DS}$ over a subrange of values of $V_{DS}$ is less than −15 fF/mm/V, the subrange of values being greater than 100 mV. In some embodiments, $dC_{GD}/dV_{DS}$ over a subrange of values of $V_{DS}$ is less than −30 fF/mm/V, the range of subvalues being greater than 100 mV.

In these embodiments, there is a steep reduction in the value of the gate drain capacitance $C_DG$ at a voltage that is much lower than the working voltage of the device.

A high saturation current Idssat is achieved. In some embodiments, Idssat is at least 300 mA/mm, or at least-400 mA/mm up to 1 A/mm.

The gate drain capacitance $C_{GD}$ may be low and lie in the region of 20 fF/mm to 30 fF/mm, for example 30 fF/mm with ns=8.6 $e^{12}$ cm$^{-2}$. In some embodiments, $C_{GD}$ is less than 100 fF/mm at low voltages of 20V or 15V or even 10V. In some embodiments, $C_{GD}$ is less than 50 fF/mm at low voltages of 20V or 15V or even 10V.

In some embodiments, Rdson is less than 10 ohm*mm, or less than 5 ohm*mm or less than 3.2 ohm*mm.

In some embodiments, the Group III nitride-based transistor device comprises a gate source capacitance $C_{GS}$ and $C_{GS}/C_{DS}$ at a value of VDS, whereby $V_{DS}$ is less than 20V, is greater than 2 or greater than 3 or greater than 5.

In some embodiments, the passivation layer has a thickness $d_{FP}$ such that the field plate is spaced apart from the conductive channel by a distance such that the ratio of the gate drain capacitance ($C_{GD}$) at a drain source voltage ($V_{DS}$) of 0V, $C_{GD}(0V)$, and the gate drain capacitance $C_{GD}$ at a value of $V_{DS}>0V$, $C_{GD}V$, is more than 3:1 or is at least 5:1, wherein $V_{DS}$ is less than 15V.

In some embodiments, the passivation layer has a thickness $d_{FP}$ such that the field plate is spaced apart from the conductive channel by a distance such that the ratio of the value of $C_{GD}$ at a $V_{DS}=0V$ and the value of $C_{GD}$ at a $V_{DS}$ voltage in the range of $0<V_{DS}<15V$ is greater than 3 and/or such that the ratio of the value of $C_{GD}$ at a $V_{DS}=0V$ and the value of $C_{GD}$ at a $V_{DS}$ voltage in the range of $0<V_{DS}<15V$ is greater than 4 such that the ratio of the value of $C_{GD}$ at a $V_{DS}=0V$ and the value of $C_{GD}$ at a $V_{DS}$ voltage in the range of $0<V_{DS}<15V$ is greater than 5 and/or such that the ratio of the value of $C_{GD}$ at a $V_{DS}=0V$ and the value of $C_{GD}$ at a $V_{DS}$ voltage in the range of $0<V_{DS}<12V$ is greater than 3 and/or such that the ratio of the value of $C_{GD}$ at a $V_{DS}=0V$ and the value of $C_{GD}$ at a $V_{DS}$ voltage in the range of $0<V_{DS}<10V$ is greater than 5 and/or such that the ratio of the value of $C_{GD}$ at a $V_{DS}=0V$ and the value of $C_{GD}$ at a $V_{DS}$ voltage in the range of $0<V_{DS}<20V$ is greater than 6.

As a highly resistive semiconductor can act as a dielectric, in some embodiments, the distance between the metal field plate and the two dimensional charge gas is selected depending on the dielectric constant of the material between the metal field plate and the two dimensional charge gas, i.e. the material of the passivation layer and intervening semiconductor material, such that the ratio of the gate drain capacitance ($C_{GD}$) at a drain source voltage ($V_{DS}$) of 0V, $C_{GD}$(0V), and the gate drain capacitance $C_{GD}$ at a value of $V_{DS}>0V$, $C_{GD}V$, is more than 3:1 or at least 4:1, or at least 5:1 wherein $V_{DS}$ is less than 15V and/or such that the ratio of the value of $C_{GD}$ at a $V_{DS}=0V$ and the value of $C_{GD}$ at a $V_{DS}$ voltage in the range of $0<V_{DS}<12V$ is greater than 3 and/or such that the ratio of the value of $C_{GD}$ at a $V_{DS}=0V$ and the value of $C_{GD}$ at a $V_{DS}$ voltage in the range of $0<V_{DS}<10V$ is greater than 5 and/or such that the ratio of the value of $C_{GD}$ at a $V_{DS}=0V$ and the value of $C_{GD}$ at a $V_{DS}$ voltage in the range of $0<V_{DS}<20V$ is greater than 6.

In some embodiments, the dielectric constant of the material between the field plate and the first major surface divided by the distance between the lower surface of the field plate and the first major surface is between $5\,e^{-8}$ F/cm² and $1\,e^{-6}$ F/cm².

In some embodiments, the thickness $d_{FP}$ of the passivation layer between the lower surface of the field plate and the first major surface is 110 nm or less or 10 nm≤$d_{FP}$≤110 nm, or less than 60 nm or 10 nm≤$d_{FP}$≤60 nm.

In some embodiments the passivation layer is formed of $SiN_x$.

In some embodiments, the passivation layer is formed of an amorphous insulating material.

In some embodiments, the passivation layer is formed of a material, also known as a "high-k" dielectric, which has a higher dielectric constant compared to silicon dioxide, for example a hafnium- or zirconium-based dielectric materials such as hafnium silicate, hafnium dioxide, zirconium silicate and zirconium dioxide. This enables the thickness $d_{FP}$ of the passivation layer between the lower surface of the field plate and the first major surface to be increased, leakage to be avoided and reliability to be improved for these thin passivation layers.

In some embodiments, a base of the gate electrode has a width of 30 nm to 500 nm, or 30 nm to 350 nm or 30 nm to 250 nm and in some embodiments a width of around 250 nm or less, and the distance $d_{GF}$ between the gate electrode and the field plate at the closest point is 30 nm to 500 nm or 30 nm to 350 nm or 30 nm to 250 nm or 80 nm to 350 nm, or 80 nm to 250 nm or 100 nm and 350 nm or 100 nm to 250 nm.

In some embodiments, a base of the gate electrode has a width of 30 nm to 500 nm, or 30 nm to 350 nm or 30 nm to 250 nm and the lower surface of the field plate has a width of 30 nm to 1000 nm and the distance $d_{GF}$ between the gate electrode and the field plate at the closest point is 30 nm to 350 nm or 30 nm to 350 nm or 30 nm to 250 nm or 80 nm to 350 nm, or 80 nm to 250 nm or 100 nm and 350 nm or 100 nm to 250 nm.

In some embodiments, a base of the gate electrode and the lower surface of the field plate each have a width of 30 nm to 500 nm, or 30 nm to 350 nm or 30 nm to 250 nm and in some embodiments, a width of around 250 nm or less, and the distance $d_{GF}$ between the gate electrode and the field plate at the closest point is 30 nm to 500 nm, for example around 250 nm or less.

As the gate source capacitance, $C_{GS}$, increases for lower values, the lower limit of dGF may be increased to 80 nm or 100 nm so that the distance $d_{GF}$ between the gate electrode and the field plate at the closest point may lie in the range of 80 nm to 500 nm, or 100 nm to 500 nm.

As the current gain, h21, decreases for higher distances between the gate electrode and the field plate, the upper limit of the distance $d_{GF}$ between the gate electrode and the field plate at the closest point may be decreased to 350 nm or 250 nm so that $d_{GF}$ lies within a range of 30 nm to 350 nm or 30 nm to 250 nm. In some embodiments, $d_{GF}$ lies within the range of 80 nm to 350 nm, or 80 nm to 250 nm or 100 nm and 350 nm or 100 nm to 250 nm.

In some embodiments, the Group III nitride-based transistor device comprises a maximum stable gain (MSG) at a frequency f and a current gain h21 measured under predetermined conditions, or a maximum available gain (MAG) at a frequency f and a current gain h21 measured under the predetermined conditions, wherein a ratio MSG/h21²>6 dB, or >7 dB, or >8 dB or a ratio MAG/h21²>6 dB, or >7 dB, or >8 dB. The ratio of MSG/h21² in dB is defined as $10 \cdot \log_{10}(MSG/h21^2)$.

In some embodiments, the Group III nitride-based transistor device comprises a maximum stable gain (MSG) measured at a frequency of 4 GHz that is greater than 26 dB and the ratio MSG/h21²>6 dB, or >7 dB, or >8 dB.

In some embodiments, the Group III nitride-based transistor device comprises a maximum available gain (MAG) measured at a frequency of 4 GHz that is greater than 26 dB and the ratio MAG/h21²>6 dB, or >7 dB, or >8 dB.

In some embodiments, the Group III nitride-based transistor device comprises a maximum stable gain (MSG) measured at a frequency of 28 GHz that is greater than 12 dB and the ratio MSG/h21²>7 dB, or >10 dB, or >13 dB.

In some embodiments, the Group III nitride-based transistor device comprises a maximum available gain (MAG) measured at a frequency of 28 GHz that is greater than 12 dB and the ratio MAG/h21²>7 dB, or >10 dB, or >13 dB.

In some embodiments, the field plate comprises one or more conductive vias that extend substantially perpendicular to the first major surface and are electrically connected to the source electrode by a lateral field plate redistribution structure that extends over and is spaced apart from the gate electrode.

In some embodiments, the source electrode, the gate electrode, the drain electrode and the field plate each have an elongate form and extend on the first major surface in a longitudinal direction substantially parallel to one another.

In some embodiments, the lateral field plate redistribution structure comprises a longitudinal section positioned above the field plate and extending substantially parallel to the longitudinal direction and a plurality of transverse sections spaced at intervals in the longitudinal direction, each transverse section extending over and being spaced apart from the gate electrode and being electrically connected to the field plate by a conductive via.

In some embodiments, the Group III nitride-based transistor device further comprises a lateral gate redistribution structure, the lateral gate redistribution structure comprising a plurality of gate transverse sections, each gate transverse section being spaced apart from the gate electrode and electrically connected to the gate electrode by a conductive via, the gate transverse section of the lateral gate redistribution structure being interleaved with the transverse sections of the lateral field plate redistribution structure.

The gate transverse section or sections of the lateral gate distribution structure extend substantially perpendicularly to the length of the elongate strip-like gate electrode and in embodiments including two or more sections, are spaced at intervals along the length of the gate electrode. In some embodiments, the gate transverse section or sections of the lateral gate distribution structure are arranged in the same plane as the transverse sections of the lateral field plate redistribution structure and are spaced apart from and extend substantially parallel to the transverse sections of the lateral field plate redistribution structure.

The gate transverse sections of the lateral gate distribution structure and the transverse sections of the lateral field plate distribution structure are arranged above the active region of the Group III nitride-based transistor device within the length of the strip-like source and drain electrodes.

In some embodiments, the source electrode is electrically connected to the lateral field plate redistribution structure.

In some embodiments, the Group III nitride-based transistor device further comprises a source redistribution structure extending in the longitudinal direction and arranged above and spaced apart from the source electrode, wherein the source electrode is electrically connected by one or more conductive vias to the source redistribution structure and the source redistribution structure is integral with the transverse sections of the field plate redistribution structure.

In some embodiments, the longitudinal section of the lateral field plate redistribution structure is laterally wider than the conductive vias and the field plate.

In some embodiments, the field plate is spilt into two field plate sections that extend substantially parallel to one another and are laterally spaced apart from one another, the two field plate sections being laterally arranged between and spaced apart from the gate electrode and the drain electrode.

In some embodiments, a Group III nitride-based transistor device is provided that comprises a first passivation layer arranged on a first major surface of a Group III nitride based-based layer, a second passivation layer arranged on the first passivation layer, a source ohmic contact, a drain ohmic contact and a gate positioned on the first major surface of a Group III nitride based-based layer, wherein the gate is laterally arranged between the source ohmic contact and the drain ohmic contact and comprises a gate via extending to an upper surface of the second passivation layer. The Group III nitride-based transistor device also comprises a field plate that is laterally arranged between and spaced apart from the gate and the drain ohmic contact and extends to an upper surface of the second passivation layer. The Group III nitride-based transistor device also comprises a first via extending from the source ohmic contact to an upper surface of the second passivation layer, a second via extending from the drain ohmic contact to the upper surface of the second passivation layer, wherein the second passivation layer covers peripheral regions of the source ohmic contact and the drain ohmic contact, and a first substantially planar insulating layer arranged on the upper surface of the second passivation layer and on peripheral regions of the gate electrode, the field plate, the first via and the second via.

In some embodiments, a base of the gate electrode has a width of 30 nm to 500 nm and the distance $d_{GF}$ between the gate electrode and the field plate at the closest point is 30 nm to 500 nm.

In some embodiments, the base of the gate electrode has a width of 30 nm to 500 nm and the lower surface of the field plate has a width of 30 nm to 1000 nm and the distance $d_{GF}$ between the gate electrode and the field plate at the closest point is 30 nm to 350 nm.

In some embodiments, a base of the gate electrode and a base of the field plate each have a width of 50 nm to 400 nm, or 200 nm to 350 nm, for example around 250 nm and the distance between the gate electrode and the field plate at the closest point is 100 nm to 400 nm, or 200 nm to 350 nm, for example around 250 nm.

In some embodiments, the source ohmic contact comprises a base portion having a conductive surface, the conductive surface comprising a peripheral portion and a central portion, the peripheral portion and the central portion being substantially coplanar and being of differing composition.

In some embodiments, the first via is positioned on the central portion of the conductive surface.

In some embodiments, the drain ohmic contact comprises a base portion having a conductive surface, the conductive surface comprising a peripheral portion and a central portion, the peripheral portion and the central portion being substantially coplanar and being of differing composition.

In some embodiments, the second via is positioned on the central portion of the conductive surface.

In some embodiments, the central portion comprises TiN and the peripheral portion comprises aluminium or an aluminium copper or a titanium aluminium alloy.

In some embodiments, a base of the field plate is in direct contact with the first passivation layer, a base of the gate via is in direct contact with the first major surface, the source ohmic contact extends at least partially through the first passivation layer, and the drain ohmic contact extends at least partially through the first passivation layer.

In some embodiments, the field plate extends substantially perpendicular to the first major surface and is electrically connected to the source electrode by a lateral field plate redistribution structure that extends over and is spaced apart from the gate electrode.

In some embodiments, the source electrode, the gate electrode, the drain electrode and the field plate each have an elongate form and extend on the first major surface in a longitudinal direction substantially parallel to one another.

In some embodiments, the lateral field plate redistribution structure comprises a longitudinal section positioned above the field plate and extending substantially parallel to the longitudinal direction and a plurality of transverse sections spaced at intervals in the longitudinal direction, each transverse section extending over and being spaced apart from the gate electrode and being electrically coupled to the field plate by a field plate conductive via.

In some embodiments, the Group III nitride-based transistor device further comprises a lateral gate redistribution structure, the lateral gate distribution structure comprising a plurality of gate transverse sections that extend substantially perpendicularly to the longitudinal direction, each gate transverse section being spaced apart from the gate electrode and electrically connected to the gate electrode by a gate conductive via, the gate transverse section of the lateral gate distribution structure being interleaved with the transverse sections of the lateral field plate distribution structure.

In some embodiments, the source electrode is electrically connected to the lateral field plate redistribution structure.

In some embodiments, the gate transverse section or sections of the lateral gate distribution structure are arranged in the same plane as the transverse sections of the lateral field plate redistribution structure and are spaced apart from and extend substantially parallel to the transverse sections of the lateral field plate redistribution structure. The gate transverse sections of the lateral gate distribution structure and the transverse sections of the lateral field plate distribution structure are arranged above the active region of the Group III nitride-based transistor device within the length of the strip-like source and drain electrodes.

In some embodiments, the Group III nitride-based transistor device further comprises a source redistribution structure extending in the longitudinal direction and arranged above and spaced apart from the source electrode, wherein the source electrode is electrically connected by one or more source conductive vias to the source redistribution structure and the source redistribution structure is integral with the transverse sections of the field plate redistribution structure.

The source redistribution structure may be arranged in the same plane as the gate and field plate redistribution structures.

In some embodiments, the longitudinal section of the lateral field plate redistribution structure is laterally wider than the field plate.

In some embodiments, the field plate is spilt into two field plate sections that extend substantially parallel to one another and are laterally spaced apart from one another, the two field plate sections being laterally arranged between and spaced apart from the gate electrode and the drain electrode.

Those skilled in the art will recognize additional features and advantages upon reading the following detailed description, and upon viewing the accompanying drawings.

BRIEF DESCRIPTION

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

FIG. 7a illustrates a graph of MAG, MSG and h21, FIG. 7b a graph of $MSG/h21^2$ and $MAG/h21^2$ measured for a transistor structure having the dimensions shown in FIG. 7c.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aPbN_{(1-a-b)}$), for example. Aluminum gallium nitride and AlGaN refers to an alloy described by the formula $Al_xGa_{(1-x)}N$, where 0<x<1.

In some embodiments described herein, a Group III nitride-based transistor device is provided that has a short gate length Lg, for example Lg≤250 nm, and an optimized feed-back capacitance Cgd. Such short gate lengths are useful for radio-frequency application transistors requiring a high transition frequency fT in the range 50 GHz to 150 GHz. Such short gate lengths can be achieved using high precision patterning using DUV photolithography processes.

Figure 1A:
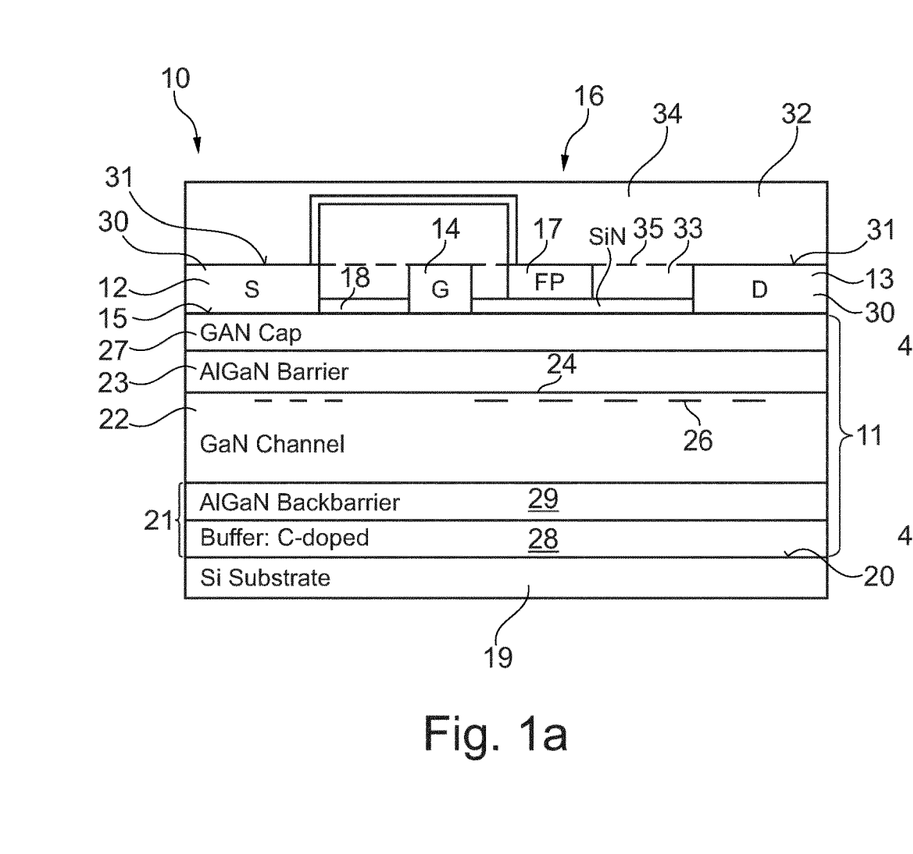
FIG. 1a illustrates a cross-sectional view and FIG. 1b a plan view of a Group III nitride-based transistor device according to an embodiment.
Figure 1B:
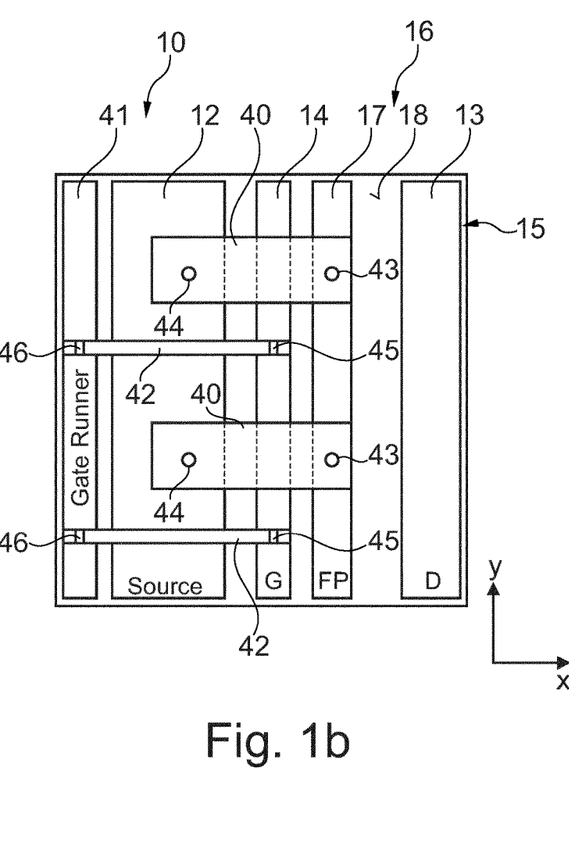

FIG. 1a illustrates a schematic cross-sectional view and FIG. 1b a plan view of a Group III nitride-based device 10 according to an embodiment.

The Group III nitride-based device 10 includes a Group III nitride-based layer 11. A first ohmic contact 12, a second ohmic contact 13 and a gate 14 are arranged on a first major surface 15 of the Group III nitride-based layer 11. The Group III nitride-based device 10 may be a transistor device 16 such as a High Electron Mobility Transistor (HEMT). In embodiments in which the Group III nitride device 10 is a transistor device 16, the first ohmic contact 12 may provide a source contact and the second ohmic contact 13 may provide a drain contact.

The gate 14 is arranged laterally between the source contact 12 and the drain contact 13. The Group III nitride-based device 10 also includes a field plate 17 that is positioned on the first major surface 15 and laterally between and spaced apart from the gate 14 and the drain contact 13.

The Group III nitride-based layer 11 is formed on a substrate 19, which may be a foreign substrate, which has a growth surface 20 which is capable of supporting the epitaxial growth of at least one Group III nitride layer. The support substrate 20 may be monocrystalline silicon substrate, for example a <111> or <110> silicon wafer or a monocrystalline sapphire substrate.

The Group III nitride-based layer 11 may be have multiple layers. The multilayer Group III nitride structure 11 may include a Group III nitride buffer structure 21 arranged on the growth surface 20, a Group III nitride channel layer 22 arranged on the Group III nitride buffer structure 21 and a Group III nitride barrier layer 23 arranged on the Group III nitride channel layer 22. The Group III nitride barrier layer 23 has a different composition and bandgap to the Group III nitride channel layer 22 such that a heterojunction 24 is formed therebetween. For example, the Group III nitride channel layer 22 may comprise gallium nitride and the Group III nitride barrier layer 23 may comprise aluminium gallium nitride. The heterojunction 24 is capable supporting a two-dimensional charge gas which is indicated schematically in the in FIG. 1 by the dashed line 26. The first ohmic contact 12 and the second ohmic contact 13 form an ohmic contact with the two-dimensional charge gas 26.

The Group III nitride layer 11 may also include a further Group III nitride layer 27 arranged on the Group III nitride barrier layer 23. The further Group III nitride layer 27 may be a gallium nitride cap layer, for example.

A typical buffer structure 21 for a silicon substrate includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer of AlGaN back barrier is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

In some embodiments, such as that illustrated in FIG. 1a, the buffer structure 21 includes carbon doped Group III nitride-based buffer layer 28 arranged on the substrate 20 and a Group III nitride back barrier layer 29 arranged on the carbon doped Group III nitride-based buffer layer 28. The channel layer 22 is arranged on the Group III nitride back barrier layer 29. The Group III nitride back barrier layer 29 includes a Group III nitride having a larger bandgap than the channel layer 22 and may be formed of aluminium gallium nitride when the channel layer 22 is formed of gallium nitride, for example.

The Group III nitride-based device 10 includes a first passivation layer 18 arranged on the first major surface 15 of the Group III nitride-based layer 11. The passivation layer 18 may be formed of silicon nitride.

The source contact 12, the gate 14 and the drain contact 15 extend through the first passivation layer 18, whereas the field plate 17 is arranged on the first passivation layer 18 and spaced apart from the underlying Group III nitride-based layer 11 by the first passivation layer 18. In some embodiments, the source contact 12, the gate 14 and the drain contact 15 are in direct contact with the Group III nitride-based layer 11. In the embodiment illustrated in FIG. 1A, the source contact 12, the gate 14 and the drain contact 15 are in direct contact with the Group III nitride-based cap layer 27.

In some embodiments, each of the first and second ohmic contacts 12, 13 comprises a base portion 30 having an upper conductive surface 31 that is positioned within a second passivation layer 32 that is arranged on the first passivation layer 18. Each of the ohmic contacts 12, 13 may have the same structure. The ohmic contacts 12, 13 may be fabricated at substantially the same time and are fabricated before the fabrication of the gate 14 and the field plate 17. The gate 14 and the field plate 17 are each formed of conductive material. The gate 14 may be a Schottky contact. In other embodiments, the transistor device 16 includes an insulated gate contact. In some embodiments, the gate 14 includes a p-doped Group III nitride region arranged on the Group III nitride layer 11 and a metal gate arranged on the p-doped Group III nitride region.

A second passivation layer 32 is positioned on the source ohmic contact 12, the drain ohmic contact 13, the gate 14, the field plate 17 and the first passivation layer 18. As is indicated by the dotted line 31 in FIG. 1, the second passivation layer 32 may include two sublayers 33, 34. The lower sublayer 33 is positioned on the Group III nitride-based layer 11 and, during manufacture of the Group III nitride-based device 10, formed a planar surface with the conductive surface 31 of the base portion 30 of the first and second ohmic contacts 12, 13 before the deposition of the upper sublayer 34 onto the planar surface. The lower and upper sublayers 33, 34 may have the same composition, for example silicon oxide, and may be formed using a TEOS (Tetraethyl orthosilicate) process.

The first passivation layer 18 is positioned between the upper surface of the Group III nitride-based layer 11 and the second passivation layer 31 and may a different composition to the second passivation layer 31.

The formation of this planarised surface, represented by the dotted line 35, enables the subsequent layers built up upon it to be planar. This enables the gate 14 and field plate 17 to be formed using photolithographic techniques after the fabrication of the ohmic contacts 22,23, whereby the photoresist mask and deposition processes for fabricating at least a base portion of the gate 14 and field plate 17 can be carried out on this planarised surface 35. This method enables the photoresist layer for the gate 14 and field plate 17 to be more accurately structured, since it is formed on a planar surface 35 and can be formed after the ohmic contacts 22, 23 are formed to the multilayer Group III structure 11, which typically involves higher processing temperatures. As a result of the more accurate structuring of the photoresist layer, the dimensions and position of the gate 14 and field plate 17 can be more accurately controlled. This also enables the distance $d_{SG}$ between the ohmic source contact 12 and the gate 14, as measured at the base of the ohmic contact 12 and gate 14, to be reduced and to be reliably produced at this reduced length. The gate to source distance $d_{SG}$ may be less than 0.5 μm, for example 250 nm or less in order to lower $R_{DSON}$ and enhance device performance. The more accurate structuring of the photoresist layer, the position of the field plate 17 with respect to the gate, $d_{GFP}$, can also be more reliably controlled and may also be less than 0.5 μm, for example 30 nm to 500 nm, 30 nm to 350 nm or 250 nm or less, for example 30 nm to 250 nm.

Additionally, the critical dimension control of the gate process is improved to enhance manufacturability and device performance. The gate length $L_G$ and/or the length of the field plate $L_{FP}$ may also be less than 0.5 μm, for example 250 nm or less. This high precision patterning of the gate electrode is enabled as the photoresist processes of the gate and field plate are not affected by topography steps created by the Ohmic metal contacts 12, 13 due to the formation of the planarized surface 35 after the formation of the base portion 16.

Such topography steps would impair the local uniformity of the involved anti-reflection-coating and resist coating processes and would degrade the depth-of-focus of the lithographic exposure process. In effect the control of small dimension lithographic structures would be severely limited.

In some embodiments, the upper conductive surface 21 of the ohmic contacts 22, 23 includes a single composition. The ohmic contacts 22, 23 may include a single composition or may include a stack of two or more layers of differing composition.

In some embodiments, the upper conductive surface 21 of the ohmic contacts 22, 23 includes two regions of differing composition that are coplanar. The central portion and peripheral portion may be provided as the upper surface of a base portion that includes a well comprising a metal or alloy of a first composition extending into a lower portion comprising a metal or alloy of a second different composition. The upper surface of the well provides the central portion of the conductive surface and the upper surface of the lower portion provides the peripheral portion of the conductive surface, so that the upper surface of the well and the upper surface of the lower portion are substantially coplanar.

In some embodiments, the well and the central portion of the conductive surface comprise a conductive barrier material and the lower portion and peripheral portion comprise an ohmic contact material. An ohmic contact material is material which forms an ohmic contact to the Group III nitride material of the uppermost Group III nitride layer of the multilayer Group III nitride structure 11. In some embodiments, the conductive barrier material of the well and the central portion of the conductive surface comprise titanium nitride and the lower portion and peripheral portion of the conductive surface comprise aluminium or aluminium copper alloy or a titanium aluminium alloy.

The base portion 20 of the ohmic contacts 12, 13 and the lower portion of the gate via 14 may be referred to as electrodes, i.e. source electrode, gate electrode and drain electrode.

Referring to the top view of FIG. 1b, the ohmic contacts 12, 13, the gate 14 and the field plate 17 have an elongate strip-like structure having a longest dimension or length that extends into the plane of the drawing of FIG. 1A and that extends in the longitudinal direction or Y direction of the transistor device 10 as shown using the Cartesian coordinate system. The ohmic contacts 12, 13, the gate 14 and the field plate 17 extend substantially parallel to one another. The field plate 17 is laterally positioned in the X-direction between and spaced apart from the gate 14 and drain ohmic contact 13.

The field plate 17 is electrically connected to source potential and to the source ohmic contact 12 by one or more transverse conductive portions 40 of a metallization structure that extend in the X-direction and substantially perpendicularly to the length of the field plate 17. In embodiments including two or more transverse portions 40, each transverse portion 40 is spaced apart from the neighbouring transverse portion 40 in the Y direction. The transverse portions are arranged above and spaced apart from the first major surface 15 by one or more passivation or insulating layers, for example the first and second passivation layers 18, 32. The transverse portions 40 are electrically connected to the field plate 17 and ohmic source contact 12 by conductive vias 43, 44, respectively.

The gate 14 may be electrically connected to a gate runner 41 that is positioned laterally adjacent to and spaced apart from a side of the elongate source ohmic contact 12 that opposes the side facing towards the gate 14. The gate 14 may be electrically connected to a gate runner 41 by one or more transverse portions 42 of a metallization structure that extend laterally between the gate runner 41 and the gate 14 and over the source ohmic contact 12. The transverse portions 42 connected to the gate 14 and transverse portions 41 connected to the field plate 17 may be arranged alternately in the Y direction. The transverse portions 42 are arranged above and spaced apart from the field plate 17 and source ohmic contact 12 by one or more passivation or insulating layers. The transverse portions 42 are electrically connected to the gate 14 and gate runner 41 by conductive vias 45, 46, respectively.

The transverse sections 40 which are electrically connected to the field plate and the transverse sections 42 which are connected to the gate 14 may be arranged in the same plane and are positioned above the active region of the Group III nitride transistor device 10.

In any transistor device, there is a trade-off between low Rdson which also translates into high saturation current and parasitic coupling capacitances, namely the feedback capacitance Cgd. The lower the Rdson the higher the Cgd and Cds. A high Cgd has various drawbacks in the design of RF and mm-wave power amplifiers, for example reducing the gain, degrading stability and is aversively affecting the required matching for certain applications.

A source-connected field plate in close enough proximity to the gate/drain channel may be used to pinch off the gate/drain channel, i.e. deplete it at a certain voltage which typically should be lower than the applied DC drain voltage. However, this becomes more challenging the higher the sheet charge of that channel and the lower the applied DC drain voltage. In the case of RF Group III nitride-based transistors, the sheet charge is high so that such channels can only be depleted at voltages of 30V or higher.

According to embodiments described herein, a Group III nitride-based transistor device is provided with electrical device characteristics, namely very low Cgd and still high Isat which increases gain and stability at the same time while not significantly loosing saturation current. This can be used to provide high frequency circuits with much higher performance.

Another advantage is a significantly reduced feedback to the input which significantly improves the input matching. A Group III nitride-based transistor device, for example a HEMT is disclosed that has a short gate length Lg, for example Lg≤250 nm, and an optimized feed-back capacitance Cgd. Such short gate lengths are useful for radio-frequency application transistors requiring a high transition frequency fT in the range 50 GHz to 150 GHz.

In some embodiments, the Group III nitride-based transistor device has a gate drain capacitance ($C_{GD}$), a drain source capacitance ($C_{DS}$) and a drain source on resistance (RDSon). A ratio of the gate drain capacitance ($C_{GD}$) at a drain source voltage ($V_{DS}$) of 0V, $C_{GD}(0V)$, and the gate drain capacitance $C_{GD}$ at a value of $V_{DS}>0V$, $C_{GD}V$, is at least 3:1, wherein $V_{DS}$ is less than 15V.

In some embodiments, the Group III nitride-based transistor device has a $dC_DG/dV_{DS}$ over a range of values of $V_{DS}$ is less than −10 fF/mm/V, the range of values being greater than 100 mV.

In some embodiments, the Group III nitride-based transistor device comprises a value of Rdson is less than 10 ohm*mm.

In some embodiments, the Group III nitride-based transistor device comprises a ratio of $C_{GS}/C_{DS}$ at a value of $V_{DS}$, whereby $V_{DS}$ is less than 20V, that is greater than 2 or greater than 3 or greater than 5.

In some embodiments, the passivation layer 18 has a thickness $d_{FP}$ such that the field plate is spaced apart from the conductive channel by a distance such that the ratio of the gate drain capacitance ($C_{GD}$) at a drain source voltage ($V_{DS}$) of 0V, $C_{GD}(0V)$, and the gate drain capacitance $C_{GD}$ at a value of $V_{DS}>0V$, $C_{GD}V$, is more than 3:1, wherein $V_{DS}$ is less than 15V.

In some embodiments, the ratio of the value of $C_{GD}$ at a $V_{DS}=0V$ and the value of $C_{GD}$ at a $V_{DS}$ voltage in the range of $0<V_{DS}<15V$ is greater than 3 or 4 or 5 and/or the ratio of the value of $C_{GD}$ at a $V_{DS}=0V$ and the value of $C_{GD}$ at a $V_{DS}$ voltage in the range of $0<V_{DS}<12V$ is greater than 3 and/or the ratio of the value of $C_{GD}$ at a $V_{DS}=0V$ and the value of $C_{GD}$ at a $V_{DS}$ voltage in the range of $0<V_{DS}<10V$ is greater than 5 and/or the ratio of the value of $C_{GD}$ at a $V_{DS}=0V$ and the value of $C_{GD}$ at a $V_{DS}$ voltage in the range of $0<V_{DS}<20V$ is greater than 6.

In some embodiments, the thickness $d_{FP}$ of the passivation layer 18 between the lower surface of the field plate and the first major surface is 110 nm or less or 10 nm≤$d_{FP}$≤110 nm. The passivation layer 18 may be formed of a high-k dielectric, for example a hafnium- or zirconium-based dielectric materials such as hafnium silicate, hafnium dioxide, zirconium silicate and zirconium dioxide.

In some embodiments, the dielectric constant of the material between the field plate 17 and the first major surface 15 divided by the distance between the lower surface of the field plate 17 and the first major surface 15 is between 5 e-8 F/cm² and 1 e-6 F/cm².

In some embodiments, a base of the gate 14 and the lower surface of the field plate 17 each have a width of 30 nm to 500 nm, or 50 nm to 400 nm, for example 250 nm and the distance dGF between the gate 14 and the field plate 17 at the closest point is 30 nm to 350 nm, for example 250 nm. In some embodiments, the lower surface of the field plate 17 has a larger width for example in the range of 50 nm to 1000 nm or 500 nm to 1000 nm.

In some embodiments, the Group III nitride-based transistor device comprises a maximum stable gain (MSG) at a frequency f and a current gain h21 measured under predetermined conditions, or a maximum available gain (MAG) at a frequency f and a current gain h21 measured under the predetermined conditions, wherein a ratio MSG/h21²>6 dB, or >7 dB, or >8 dB or a ratio MAG/h21²>6 dB, or >7 dB, or >8 dB. The ratio of MSG/h21² in dB is defined as $10 \cdot \log_{10}(MSG/h21^2)$.

In some embodiments, the Group III nitride-based transistor device comprises a maximum stable gain (MSG) measured at a frequency of 4 GHz that is greater than 26 dB and the ratio MSG/h21²>6 dB, or >7 dB, or >8 dB.

In some embodiments, the Group III nitride-based transistor device comprises a maximum available gain (MAG) measured at a frequency of 4 GHz that is greater than 26 dB and the ratio MAG/h21²>6 dB, or >7 dB, or >8 dB.

In some embodiments, the Group III nitride-based transistor device comprises a maximum stable gain (MSG) measured at a frequency of 28 GHz that is greater than 12 dB and the ratio MSG/h21²>7 dB, or >8 dB, or >9 dB, or >10 dB, or >13 dB.

In some embodiments, the Group III nitride-based transistor device comprises a maximum available gain (MAG) measured at a frequency of 28 GHz that is greater than 12 dB and the ratio MAG/h21²>7 dB, or >8 dB, or >9 dB, or >10 dB, or >13 dB.

Methods for fabricating Group III nitride-based devices, such as transistor devices, are used that enable the fabrication of a device with a short gate length Lg, for example Lg≤250 nm, and an optimized feed-back capacitance Cgd. Such short gate lengths are useful for radio-frequency application transistors requiring a high transition frequency fT in the range 50 GHz to 150 GHz. Such short gate lengths can be achieved using high precision patterning for which photolithography processes with thin photo resist flows are required, for example DUV photolithography processes.

The processing of such photoresists is highly sensitive to topography steps on a wafer, such as steps created by the Ohmic Metal of the source and drain contacts that is fabricated prior to the gate structure. This disclosure makes use of an ohmic metallization concept which leaves no topography steps such as vertical steps due to RIE (Reactive Ion Etching) patterning of the Ohmic metal stack for the source and drain contacts so that photolithography can be applied to form shorter gate lengths and to position the gate more closely to the source contact to reduce $R_{DSON}$. The methods can be carried out using the process capabilities of a 200 mm CMOS production line and, therefore, cost effectively on wafers having a diameter of at least 200 mm.

An Ohmic contact-first approach may be used to fabricate a Group III nitride-based device, in particular a transistor device such as a HEMT (High Electron Mobility Transistor). In an embodiment, the method is carried out on a wafer, which may have a diameter of 6 inches or more, and includes planarizing the Ohmic metal before the fabrication of the gate structure.

The ohmic metal may be formed by opening a window in the Group III nitride passivation, depositing an Ohmic metal stack, structuring the Ohmic metal stack and applying the Ohmic metal anneal step to alloy the ohmic metal. The ohmic metal can be planarized by depositing a CMP (Chemical Mechanical Polishing) stop layer on the frontside of the wafer, using chemical mechanical polishing on the structured Ohmic metal to produce a planarized surface and afterwards stripping the remaining parts of the stop layer.

The planarized surface is used for the further processing of the device, for example to form the gate using DUV photolithography without underlying topography affecting the accuracy of the photolithographic process. Advantages of this approach include enabling of a low gate to source distance to enhance device performance and improving the critical dimension control of the gate process to enhance manufacturability and device performance.

In the following, electrical characteristics of example AlGaN/GaN HEMTs grown on Si substrate with a deeply scaled source connected field plate. The epitaxial layers are grown on 200 mm high resistivity Si substrate and the devices are processed in a high-volume 200 mm silicon fabrication plant. The field plate is directly landed on the 35 nm thick SiN passivation layer next to a 0:2 µm long gate. The gate and field plate are alternately connected to a gate-runner and the source metal to assure small gate and field plate resistance.

With this field plate concept, small-signal gain is improved compared to non-field plated devices by 7.3 dB to more than 26 dB at 5.0 GHz for a drain voltage of 15V. The breakdown voltage is improved by 30 Volt to 170 Volt.

Gallium nitride (GaN) High-Electron-Mobility-Transistors are very attractive candidates for Power Amplifiers (PAs) in next generation communication systems. The advantages of III-nitride materials, such as high values of breakdown field, saturation velocity and low-field mobility outperform silicon-based devices in terms of efficiency and power density. However, commercially available GaN devices are typically grown on silicon carbide substrate coming with the disadvantage of much higher cost. The ability to grow wide bandgap nitrides on silicon substrate opens up the possibilities to offer the advantages of III-nitride materials for high volume and cost sensitive applicators. Additionally, it comes with the advantage to leverage CMOS based process capabilities for GaN devices.

Electric characteristics of a deeply scaled field plate concept for GaN HEMTs are present that makes use of the advanced metal process capabilities in a 200 mm fabrication environment to boost the breakdown voltage and small-signal gain.

The devices investigate are AlGaN/GaN heterostructures grown on high resistivity (4000 cm) 200 mm diameter silicon (111) substrate by metal-organic chemical vapour deposition. The epitaxial stack consists of a 3 nm GaN cap layer, a 18 nm thick $Al_{0.24}Ga_{0.76}N$ barrier layer, a 300 nm thick GaN channel and a $Al_{0.04}Ga_{0.96}N$ back barrier followed by a carbon doped stress mitigation buffer and an AlN nucleation layer. From hall measurements an average sheet carrier density of $8.44 \times 10^{12}$ $cm^{-2}$ with an electron mobility of 2125 $cm^2$ $V^{-1}$ $s^{-1}$ is found. Transistors are fabricated in a CMOS-compatible fabrication environment, using an all-optical DUV process. Au-free ohmic contacts are formed, yielding an average contact resistance of RC=0.5 mm for the source contact and RC=0.8 mm for the drain contact measured by transmission line model measurements. For the field-plated devices, a source connected field plate metal was landed on the 35 nm thick silicon nitride passivation layer next to the 200 nm long gate electrode without any recess. The spacing between the gate electrode and the source field plate is 300 nm.

The gate-source spacing and gate-drain distance are 0.5 µm and 1.8 µm. All electrodes are defined without any lift-off processes. The transistors are fully encapsulated by dielectrics of the multi-level damascene-based back-end-of-line (BEOL) process. The gate and source connected field plate are alternately connected to a gate-runner and ohmic source contact in the BEOL to obtain low gate and field-plate resistances. A schematic structure of the fabricated field-plated device is shown in FIG. 1.

DC and Pulsed Characteristics

Figure 2:
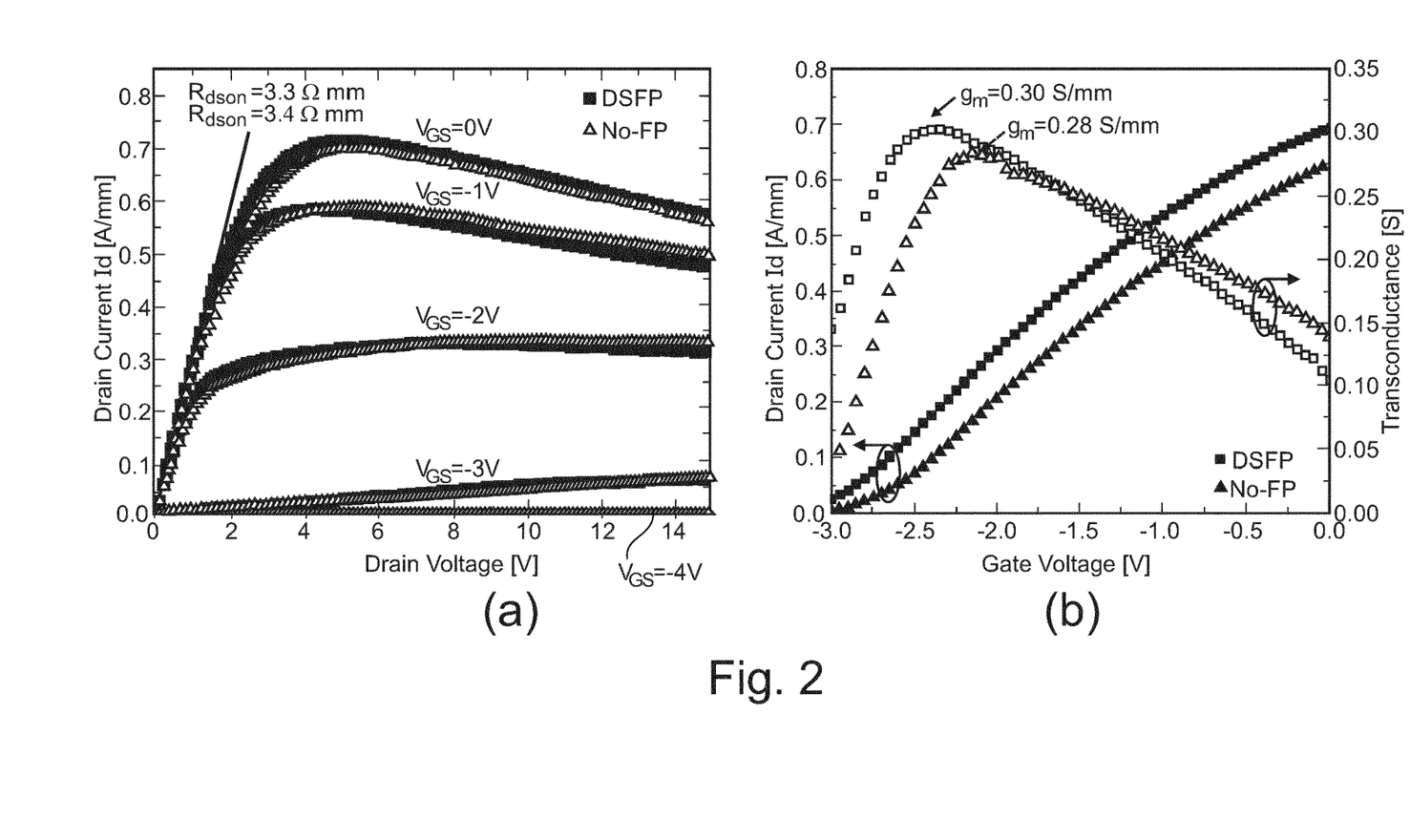
FIG. 2a illustrates DC output characteristics and FIG. 2b illustrates DC input characteristics at $V_{DS}$=15V of (0.2×2× 240) μm transistors with and without deeply scaled field-plate (DSFP).

DC output- and input-characteristics of SiN passivated transistors of (0.2×2×240) µm with and without deeply scaled source connected field plate are shown in FIG. 2a and FIG. 2b. The transistor with field plate exhibits a maximum drain current measured at VGS=0V of 0:72 $Amm^{-1}$ and the structure without field plate a maximum drain current of 0:70 $Amm^{-1}$.

Figure 3:
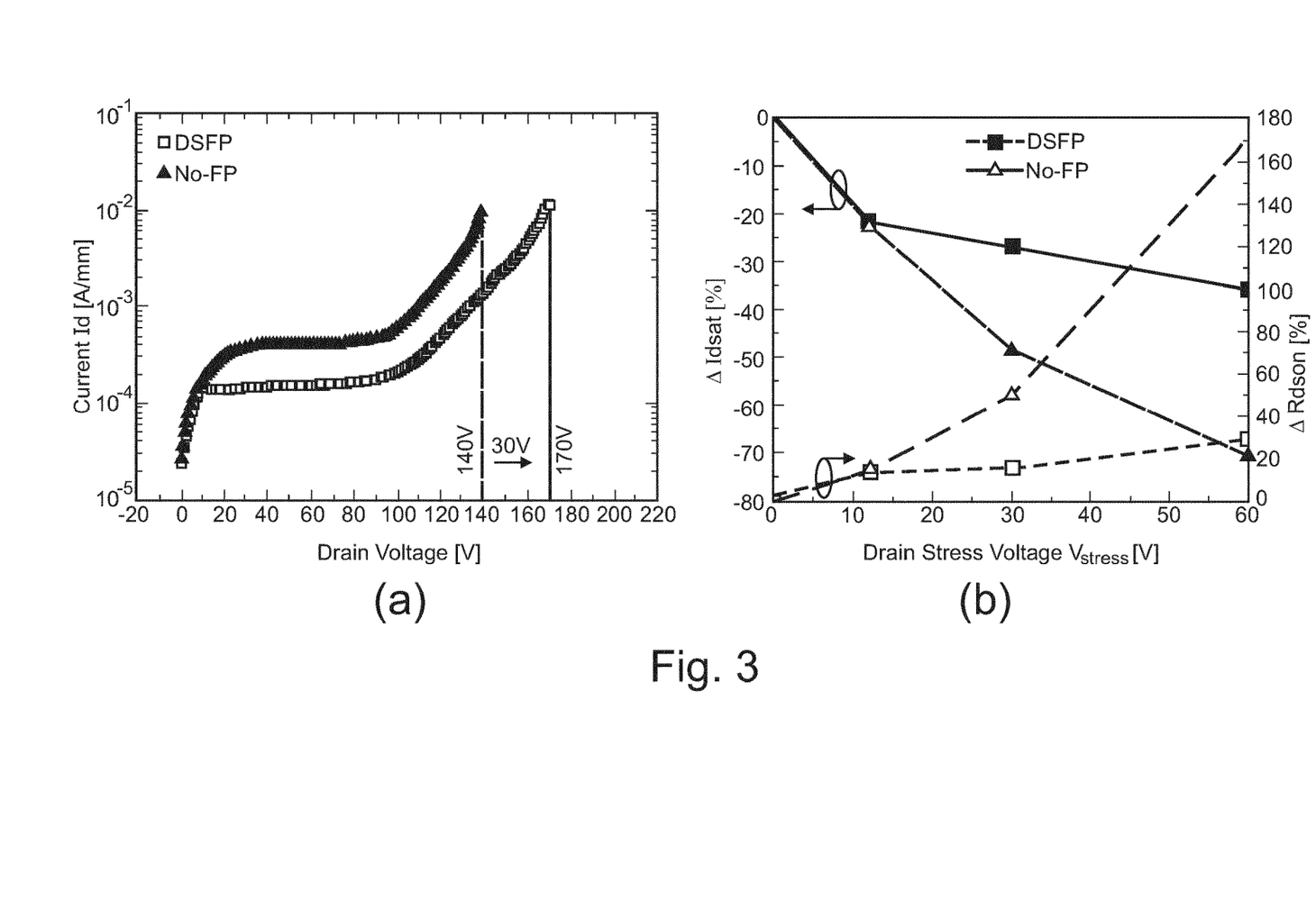
FIG. 3a illustrates Breakdown characteristics and FIG. 3b illustrates drain lag double pulse measurement of (0.2×2× 240) μm transistors with and without deeply scaled field-plate (DSFP).

FIG. 2a illustrates DC output characteristics and FIG. 2b illustrates DC input characteristics at $V_{DS}$=15V of (0.2×2×240) µm transistors with and without deeply scaled field-plate (DSFP). The maximum transconductance is determined to be gm=0.30 $Smm^{-1}$ for the field plate device and gm=0.28 $Smm^{-1}$ for the non-field plate device. The threshold voltages are Vth=−2.76V and Vth=−3.0V, respectively. With these results, both devices show no considerable difference in the dc characteristics. In contrast, the breakdown voltage is increased by 30V from 140V to 170V using the deeply scaled field plate, as shown in FIG. 3a. The lateral breakdown is determined by the sudden drain current drop during a drain voltage ramp.

FIG. 3a illustrates breakdown characteristics and FIG. 3b illustrates drain lag double pulse measurement of (0.2×2×240) µm transistors with and without deeply scaled field-plate (DSFP).

To evaluate the trapping behaviour, double pulse drain lag measurements for various drain voltage stress conditions are performed. The gate voltage was kept at an off-state of VGS=−8:0V and the drain voltage at VDS=Vstress during the stress pulse. The relative reduction of the saturation current Idsat and dynamic on resistance Rdson normalized to the unstressed value are shown in FIG. 3b. Significant less trapping is observed for the field-plated device for stress voltages greater than 12V. Both, the decrease in Idsat and the increase in Rdson could be significantly lowered. For the field-plated device, the Rdson is improved by 142% after a applying a stress voltage of 60V.

RF Characteristics

The devices RF characteristics are evaluated measuring S-parameters up to 20 GHz using a Agilent N5230A vector network analyser (VNA) and an off-chip SOLT standard. To show the impact of the deeply source connected field-plate on the RF behaviour, the off state capacitances Cgd and Cds are determined for various drain voltages. After an on-wafer open and short de-embedding, capacitances are approximated by the imaginary parts of the y-parameters at 0:5 GHz following G. Dambrine, A. Cappy, F. Heliodore, and E. Playez, "A new method for determining the FET small-signal equivalent circuit," IEEE Transactions on Microwave Theory and Techniques, vol. 36, no. 7, pp. 1151-1159, July 1988. A comparison of the bias dependent capacitances with and without deeply scaled field plated are shown in FIG. 5.

Figure 4:
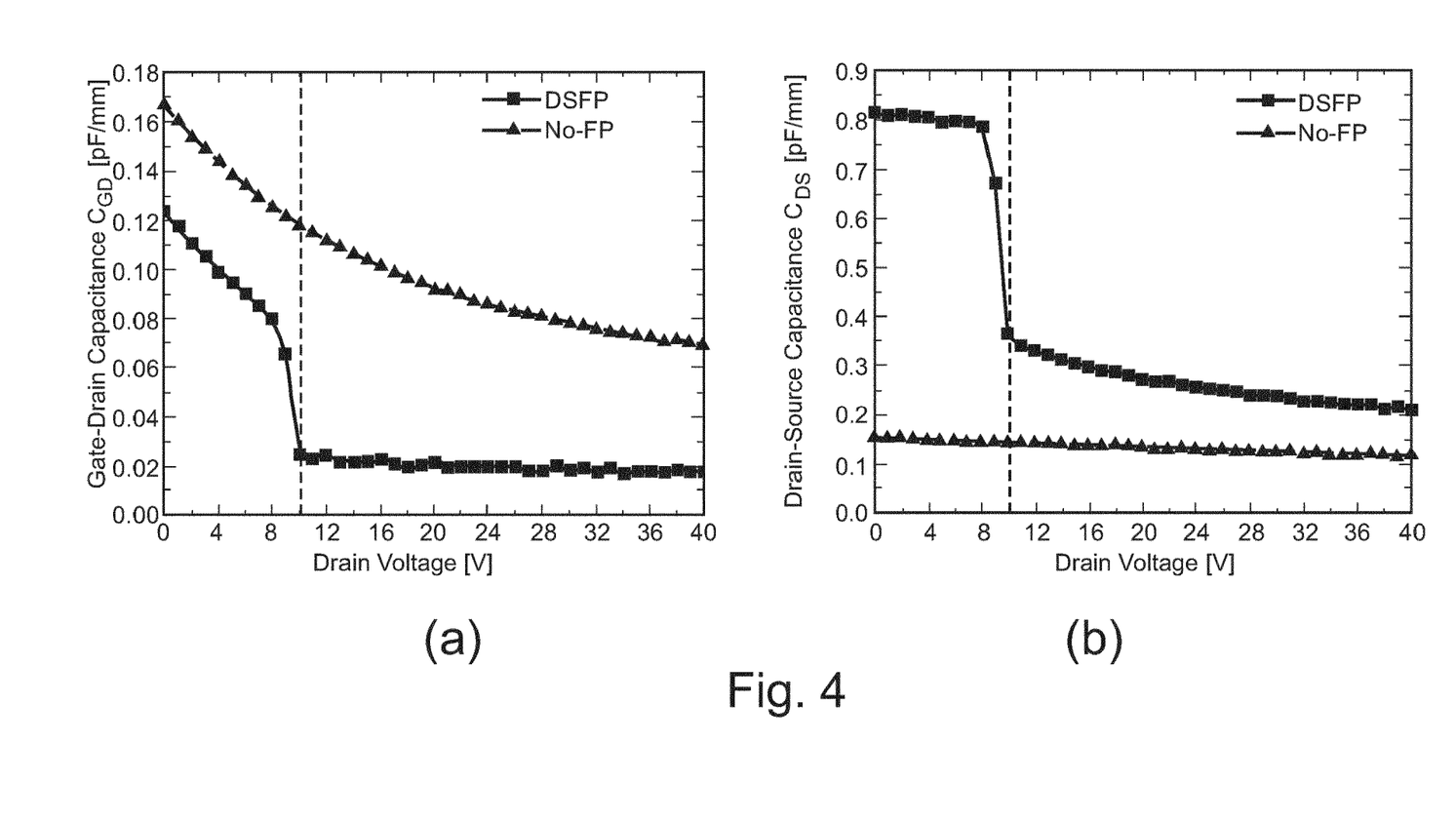
FIG. 4 illustrates OFF-State capacitances (a) $C_{GD}$ and (b) CDS with and without deeply scaled field-plate (DSFP). The pinch-off voltage of source-connected field plate is 10V.

FIG. 4 illustrates OFF-State capacitances (a) CGD and (b) CDS with and without deeply scaled field-plate (DSFP). The pinch-off voltage of source-connected field plate is 10V. The pinch-off characteristic of the deeply scaled field-plate at Vp=10V can be observed by the step decrease in CGD and CDS. The deeply scaled field plate effectively reduces the gate-drain coupling by shielding the gate electrode from the drain electrode and by extending the depletion region under the gate towards the drain after pinch-off. Both effects lead to a significant lowering of the gate-drain capacitance. Similarly, the source connected field plate leads to a strong coupling between source and drain resulting in an increased CDS.

The small-signal MSG and MAG as well as the current gain h21 are measured for both devices at a drain voltage of Vd=15V and a current of Id=100 $mAmm^{-1}$. The results are shown in FIG. 5.

Figure 5:
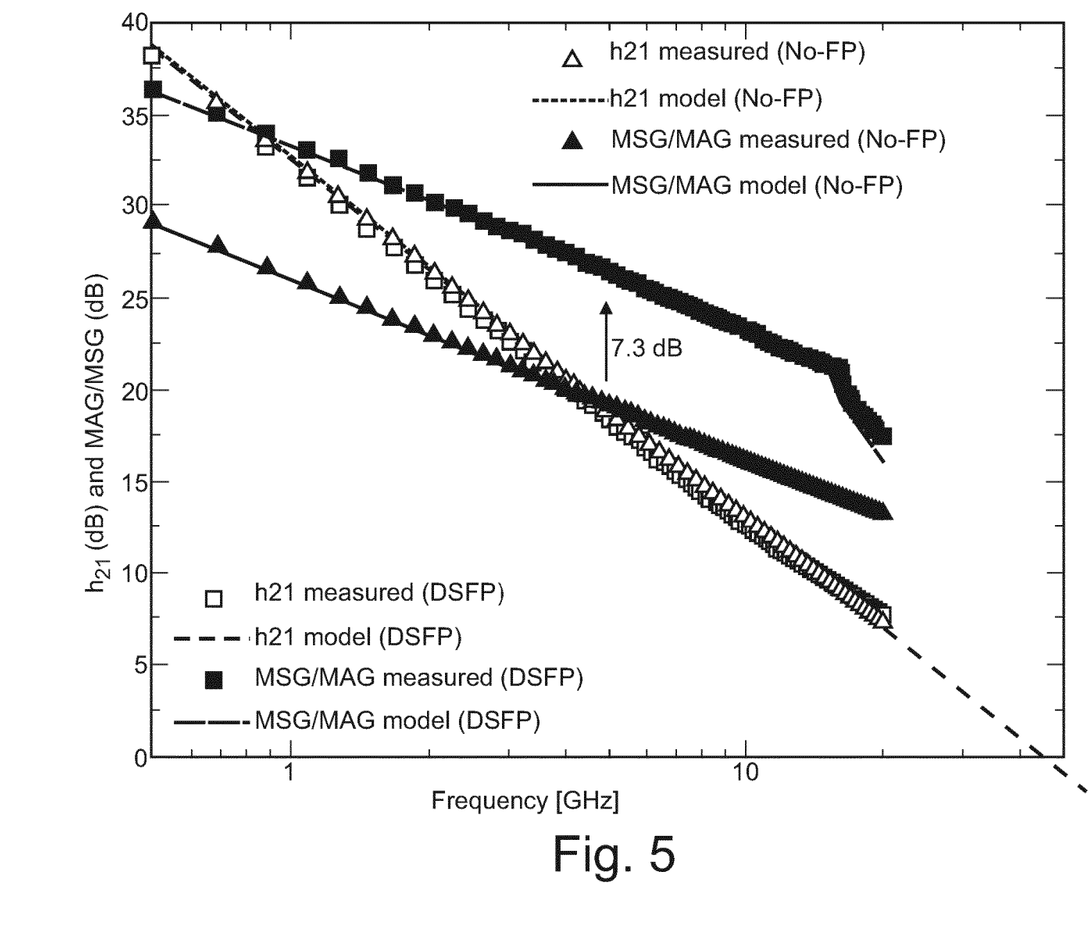
FIG. 5 illustrates Small-Signal behaviour of (0.2×2×240) μm transistors with and without deeply scaled field-plate (DSFP), showing significant gain improvement for the field plated device.

FIG. 5 illustrates the Small-Signal behaviour of (0.2×2×240) μm transistors with and without deeply scaled field-plate (DSFP), showing significant gain improvement for the field plated device. The cut-off frequency is determined by an extrapolation, giving a maximum fT=46 GHz for both devices. A standard small-signal equivalent circuit after G. Dambrine, A. Cappy, F. Heliodore, and E. Playez, "A new method for determining the FET small-signal equivalent circuit," IEEE Transactions on Microwave Theory and Techniques, vol. 36, no. 7, pp. 1151-1159, July 1988. is used to model the small-signal characteristics. The relative deviation of the measured ($S_{meas}$) and model ($S_{model}$) S-parameters ($S_{meas}-S_{model}$)/$S_{meas}$ is optimized in the full frequency range. The extrinsic and intrinsic parameters are summarized in Table I.

TABLE 1

Parameters of the small-signal model of the 2 × 240 μm device.

| Extrinsic parameters | | Intrinsic parameters | |
| --- | --- | --- | --- |
| FP | No-FP | FP | No-FP |
| $R_g$ = 2.81 Ω | Rg = 2.81 Ω | $C_{gs}$ = 0.40 pF | $C_{gs}$ = 0.35 pF |
| $R_S$ = 0.19 Ω | $R_S$ = 0.19 Ω | $C_{gd}$ = 8.3 fF | $C_{gd}$ = 45.7 fF |
| $R_D$ = 9.45 Ω | $R_D$ = 4.40 Ω | $C_{ds}$ = 0.16 pF | $C_{ds}$ = 52.8 fF |
| $L_D$ = 42.5 pH | $L_D$ = 42.5 pH | $g_m$ = 115 mS | $g_m$ = 118 mS |
| $L_G$ = 78.0 pH | $L_G$ = 53.0 pH | T = 2.2 ps | T = 1.15 ps |
| $L_S$ = 0.01 pH | $L_S$ = 0.01 pH | $R_{ds}$ = 600 Ω | $R_{ds}$ = 210 Ω |

As discussed before, the capacitance $C_{GD}$ is reduced from 95 fFmm$^{-1}$ to a value of 17 fFmm$^{-1}$ when introducing the deeply scaled source connected field plate, causing the gain increase of 7:3 dB. On explanation for the observed gain enhancement may be the thin passivation layer under the field plate as well as the small gate field-plate distance while keeping the gate and field plate resistance low.

With the deeply scaled source connected field-plate of these examples, high small-signal gain for conventional normally-on GaN-based RF-transistors is achieved.

Figure 6:
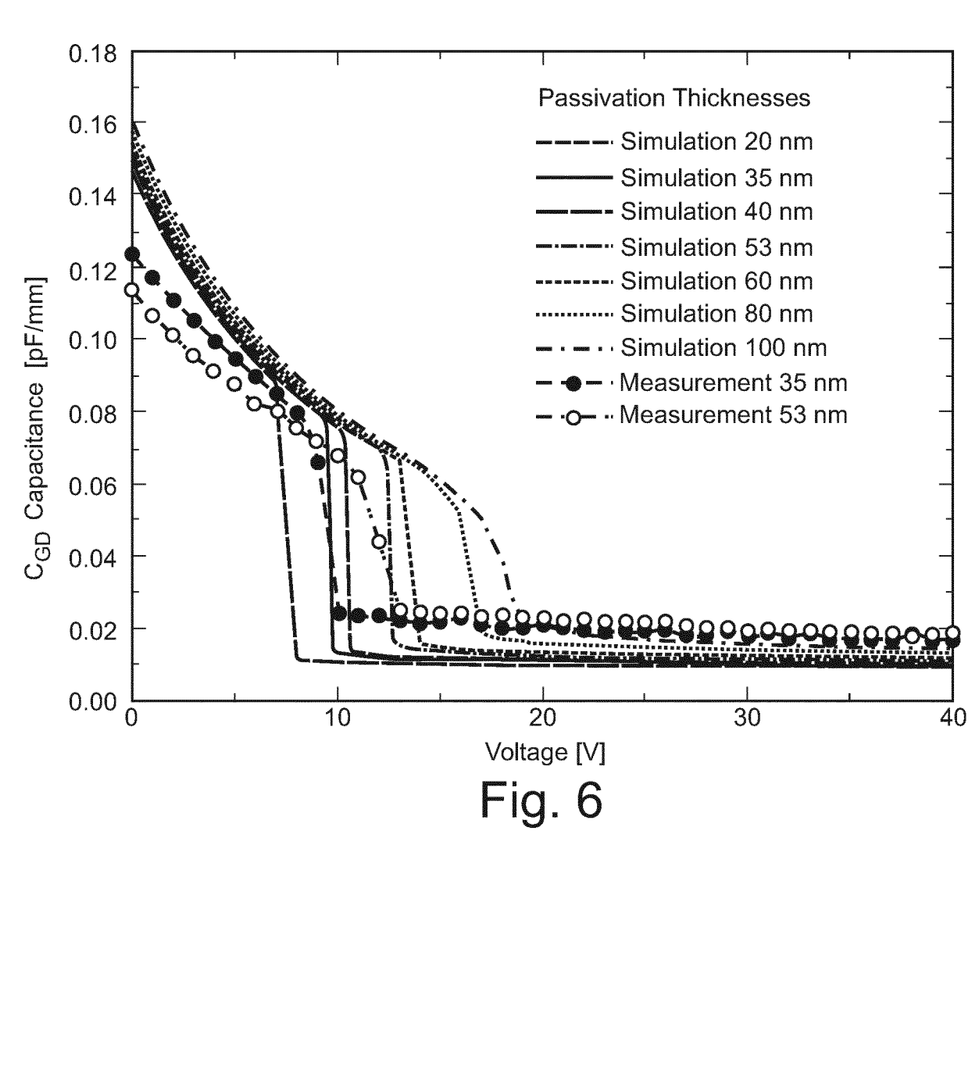
FIG. 6 illustrates a graph of the ratio of the gate drain capacitance $C_{GD}$ in pF/mm for different values of the thickness of the passivation layer.

FIG. 6 illustrates a graph of the ratio of the gate drain capacitance CGD in pF/mm measured at voltages between 0 and 40V for transistor structures having different values of the thickness of the passivation layer. Simulation results for a passivation layer thickness of 20 nm, 35 nm, 40 nm, 54 nm, 60 nm and 100 nm are shown with lines and measured results for a passivation layer of 35 nm and 53 nm are shown with symbols. The passivation layer is formed of SiNx. Each curve includes a steep decline in the gate drain capacitance at a voltage values which are less that the operating voltage of the device. For a passivation layer thickness of 20 nm, the steep decrease is seen at less than 10V and for 20 nm and 35 nm at around or slightly higher than 10V. The value of CGD at voltages above around 8 V lies in the range of 20 fF/mm to 30 fF/mm and is very low.

Figure 7A:
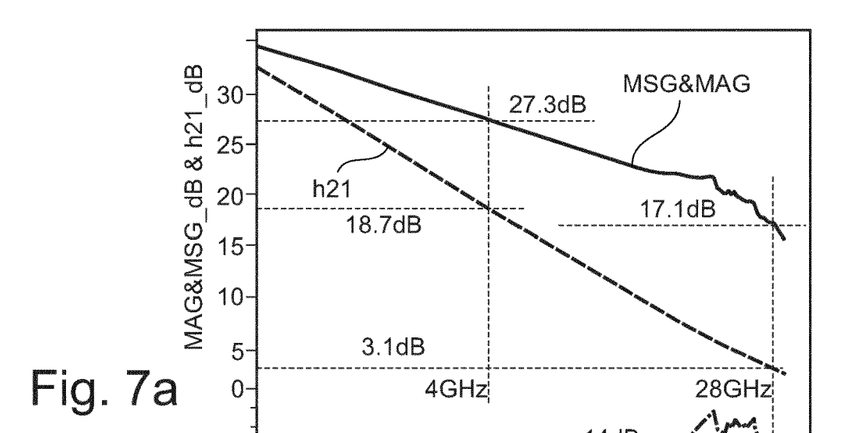
Figure 7B:
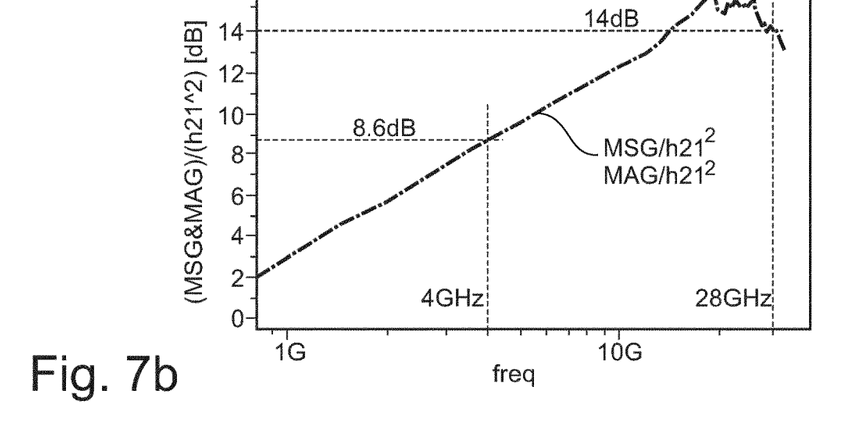
Figure 7C:
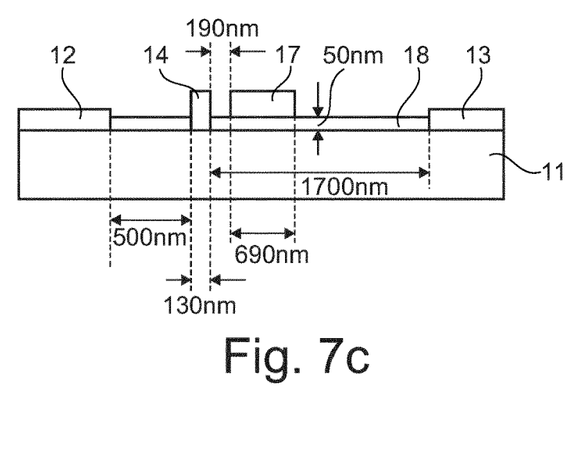

FIG. 7a illustrates a graph of MAG, MSG and h21 measured at different frequencies and FIG. 7b illustrates a graph of MSG/h21$^2$ and MAG/h21$^2$ measured at different frequencies for a Group III nitride transistor structure having the basic structure and dimensions shown in FIG. 7c and measured at V$_{DS}$=40V and Id=50 mA/mm.

In this structure, the passivation layer 18 is formed of SiN$_x$ and has a thickness d$_{FP}$ of 50 nm. The base of the gate electrode 14 has a width of 190 nm and the distance d$_{GF}$ between the gate electrode 14 and the field plate 17 is 190 nm. The field plate 17 has a width of 690 nm. The distance between the drain sided edge of the gate electrode 14 and the drain electrode 13 is 1700 nm and between the source sided edge of the gate electrode 14 and the source electrode 12 is 500 nm.

At 4 GHz, h21 is 18.7 dB, MSG and MAG is 27.3 dB MSG/h21$^2$ and MAG/h21$^2$ is 8.6 dB. At 28 GHz, h21 is 3.1 dB, MSG and MAG is 17.1 dB and MSG/h21$^2$ and MAG/h21$^2$ is 14 dB.

A deeply scaled source connected field plate concept of 0:2 μm GaN on 200 mm silicon substrate HEMTs is provided. The field plated device yields a high small signal gain reported for GaN RF transistors operated below 28V and up to X-band. The source connected field plate landed on a thin passivation layer in close proximity to the gate electrode shields electric fields from the gate and to reduce the gate-drain capacitance. Alternating gate and field-plate connections in the BEOL are used to assure low gate and field plate resistance. The novel device concept shows enhanced breakdown characteristics, lower current collapse and significant higher gain while maintaining good dc characteristics.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A Group III nitride-based transistor device, comprising:
   a source electrode, a drain electrode and a gate electrode positioned on a first major surface of a Group III nitride based-based layer, wherein the gate electrode is laterally arranged between the source electrode and the drain electrode;
   a passivation layer arranged on the first major surface; and
   a field plate electrically connected to the source electrode, the field plate having a lower surface arranged on the passivation layer, the field plate being laterally arranged between, and laterally spaced apart from, the gate electrode and the drain electrode,
   wherein the Group III nitride-based transistor device has a gate drain capacitance (C$_{GD}$), a drain source capacitance (C$_{DS}$), and a drain source on resistance (RDSon),
   wherein a ratio of the gate drain capacitance (C$_{GD}$) at a drain source voltage (V$_{DS}$) of 0V and the gate drain capacitance $C_{GD}$ at a value of $V_{DS}>0V$ is at least 3:1, wherein $V_{DS}$ is less than 15V.

2. The Group III nitride-based transistor device of claim 1, wherein the ratio of the value of $C_{GD}$ at $V_{DS}=0V$ and the value of $C_{GD}$ at $V_{DS}$ in a range of $0<V_{DS}<15V$ is greater than 4, and/or wherein the ratio of the value of $C_{GD}$ at $V_{DS}=0V$ and the value of $C_{GD}$ at $V_{DS}$ in a range of $0<V_{DS}<12V$ is greater than 3, and/or wherein the ratio of the value of $C_{GD}$ at $V_{DS}=0V$ and the value of $C_{GD}$ at $V_{DS}$ in a range of $0<V_{DS}<15V$ is greater than 5.

3. The Group III nitride-based transistor device of claim 1, wherein $dC_{GD}/dV_{DS}$ over a subrange of values of $V_{DS}$ is less than $-10fF/mm/V$, the subrange of values being greater than 100 mV, and wherein $5\ V<V_{DS}<20\ V$.

4. The Group III nitride-based transistor device of claim 1, wherein RDSon is less than 10 ohm*mm.

5. The Group III nitride-based transistor device of claim 1, wherein the Group III nitride-based transistor device has a gate source capacitance ($C_{GS}$), and wherein $C_{GS}/C_{DS}$ at $V_{DS}$ less than 20V is greater than 2.

6. The Group III nitride-based transistor device of claim 1, wherein the passivation layer has a thickness such that the field plate is spaced apart from a conductive channel by a distance such that the ratio of $C_{GD}$ at $V_{DS}$ of 0V and $C_{GD}$ at a value of $V_{DS}>0V$ is more than 3:1, and wherein $V_{DS}$ is less than 15V.

7. The Group III nitride-based transistor device of claim 6, wherein a dielectric constant of a material between the field plate and the first major surface divided by a distance between the lower surface of the field plate and the first major surface is between $5e^{-8}\ F/cm^2$ and $1e^{-6}\ F/cm^2$.

8. The Group III nitride-based transistor device of claim 6, wherein the passivation layer comprises $SiN_x$ or a material which has a higher dielectric constant compared to silicon dioxide.

9. The Group III nitride-based transistor device of claim 1, wherein the passivation layer has a thickness such that the field plate is spaced apart from a conductive channel by a distance such that the ratio of $C_{GD}$ at $V_{DS}=0V$ and $C_{GD}$ at $V_{DS}$ a range of $0<V_{DS}<15V$ is greater than 3 and/or such that the ratio of $C_{GD}$ at $V_{DS}=0V$ and $C_{GD}$ at $V_{DS}$ in a range of $0<V_{DS}<12V$ is greater than 3 and/or such that the ratio of $C_{GD}$ at $V_{DS}=0V$ and $C_{GD}$ at $V_{DS}$ a range of $0<V_{DS}<15V$ is greater than 5.

10. The Group III nitride-based transistor device of claim 9, wherein a dielectric constant of a material between the field plate and the first major surface divided by a distance between the lower surface of the field plate and the first major surface is between $5e^{-8}\ F/cm^2$ and $1e^{-6}\ F/cm^2$.

11. The Group III nitride-based transistor device of claim 9, wherein the passivation layer comprises $SiN_x$ or a material which has a higher dielectric constant compared to silicon dioxide.

12. The Group III nitride-based transistor device of claim 1, wherein a base of the gate electrode has a width in a range of 30 nm to 500 nm, and wherein a distance between the gate electrode and the field plate at a closest point is in a range of 30 nm to 500 nm.

13. The Group III nitride-based transistor device of claim 12, wherein the lower surface of the field plate has a width in a range of 30 nm to 1000 nm, and wherein the distance between the gate electrode and the field plate at the closest point is in a range of 30 nm to 350 nm.

14. The Group III nitride-based transistor device of claim 1, wherein the Group III nitride-based transistor device has a maximum stable gain (MSG) at a frequency (f) and a current gain (h21) measured under predetermined conditions, or a maximum available gain (MAG) at the frequency f and a current gain (h21) measured under the predetermined conditions, and wherein $MSG/h21^2>6$ dB, or $>7$ dB, or $>8$ dB or a ratio $MAG/h21^2>6$ dB, or $>7$ dB, or $>8$ dB.

15. The Group III nitride-based transistor device of claim 14, wherein MSG>26 dB at f=4 GHz and $MSG/h21^2>6$ dB, or $>7$ dB, or $>8$ dB, or wherein MAG>26 db at f=4 GHz and $MAG/h21^2>6$ dB, or $>7$ dB, or $>8$ dB, or wherein MSG>12 dB at f=28 GHz and $MSG/h21^2>7$ dB, or $>10$ dB, or $>13$ dB, or wherein MAG>12 dB at f=28 GHz and $MAG/h21^2>7$ dB, or $>10$ dB, or $>13$ dB.

16. The Group III nitride-based transistor device of claim 1, wherein the field plate comprises one or more conductive vias that extend substantially perpendicular to the first major surface and are electrically connected to the source electrode by a lateral field plate redistribution structure that extends over and is spaced apart from the gate electrode.

17. The Group III nitride-based transistor device of claim 16, wherein the field plate is spilt into two field plate sections that extend substantially parallel to one another and that are laterally spaced apart from one another, the two field plate sections being laterally arranged between and spaced apart from the gate electrode and the drain electrode.

18. The Group III nitride-based transistor device of claim 16, wherein the source electrode, the gate electrode, the drain electrode and the field plate each have an elongate form and extend on the first major surface in a longitudinal direction substantially parallel to one another, and wherein the lateral field plate redistribution structure comprises a longitudinal section positioned above the field plate and extending substantially parallel to the longitudinal direction and a plurality of transverse sections spaced at intervals in the longitudinal direction, each transverse section extending over and being spaced apart from the gate electrode and being electrically connected to the field plate by a conductive via.

19. The Group III nitride-based transistor device of claim 18, wherein the longitudinal section of the lateral field plate redistribution structure is laterally wider than the conductive vias and the field plate.

20. The Group III nitride-based transistor device of claim 1, further comprising a lateral gate redistribution structure that comprises a plurality of gate transverse sections, each gate transverse section being spaced apart from the gate electrode, electrically connected to the gate electrode by a conductive via and interleaved with the transverse sections of the lateral field plate distribution structure.

21. The Group III nitride-based transistor device of claim 20, wherein the source electrode is electrically connected to the lateral field plate redistribution structure.

22. The Group III nitride-based transistor device of claim 20, wherein the field plate is spilt into two field plate sections that extend substantially parallel to one another and that are laterally spaced apart from one another, the two field plate sections being laterally arranged between and spaced apart from the gate electrode and the drain electrode.

* * * * *

UNITED STATES PATENT AND TRADEMARK OFFICE
CERTIFICATE OF CORRECTION

PATENT NO. : 12,446,285 B2
APPLICATION NO. : 17/921781
DATED : October 14, 2025
INVENTOR(S) : H. Brech et al.

Page 1 of 1

It is certified that error appears in the above-identified patent and that said Letters Patent is hereby corrected as shown below:

In the Claims

Column 20, Line 10, Claim 15, Line 2, please change "$2^{>6}$ dB" to -- $^2{>}6$ dB --.
Column 20, Line 11, Claim 15, Line 3, please change "26 db" to -- 26 dB --.
Column 20, Line 12, Claim 15, Line 4, please change "$2^{>6}$ dB" to -- $^2{>}6$ dB --.
Column 20, Line 13, Claim 15, Line 5, please change "$2^{>7}$ dB" to -- $^2{>}7$ dB --.
Column 20, Line 14, Claim 15, Line 6, please change "$2^{>7}$ dB" to -- $^2{>}7$ dB --.

Signed and Sealed this
Ninth Day of December, 2025

John A. Squires
*Director of the United States Patent and Trademark Office*